United States Patent
Anderson et al.

(10) Patent No.: US 7,649,247 B2
(45) Date of Patent: Jan. 19, 2010

(54) RADIATION HARDENED LATERAL MOSFET STRUCTURE

(75) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 102 days.

(21) Appl. No.: 11/935,299

(22) Filed: Nov. 5, 2007

(65) Prior Publication Data

US 2008/0111221 A1    May 15, 2008

Related U.S. Application Data

(60) Provisional application No. 60/865,110, filed on Nov. 9, 2006.

(51) Int. Cl.
*H01L 23/495* (2006.01)
(52) U.S. Cl. ...................... 257/676; 257/500
(58) Field of Classification Search .............. 257/676, 257/500
See application file for complete search history.

(56) References Cited

U.S. PATENT DOCUMENTS

| 4,891,686 A | 1/1990 | Krausse, III |
| 4,974,059 A | 11/1990 | Kinzer |
| 6,307,755 B1 | 10/2001 | Williams et al. |
| 2009/0108467 A1* | 4/2009 | Otremba ..................... 257/777 |

* cited by examiner

*Primary Examiner*—Long Pham
(74) *Attorney, Agent, or Firm*—Robert D. Atkins

(57) ABSTRACT

A power MOSFET is provided on a semiconductor die to withstand radiation exposure. The semiconductor die is mounted on a die flag of a leadframe. The MOSFET includes a substrate and epitaxial layer formed over the substrate. A source region is formed in a surface of the semiconductor die. The source region is coupled to the die flag. A contact pad is formed on the source region. A base region is formed in the surface of the semiconductor die adjacent to the source region. The base region is electrically connected to the contact pad. A drain region is formed in the surface of the semiconductor die. The drain region is coupled to a first wire bond pad on the leadframe. A gate structure is formed over a channel between the source region and drain region. The gate structure is coupled to a second wire bond pad on the leadframe.

20 Claims, 4 Drawing Sheets

RADIATION HARDENED LATERAL MOSFET STRUCTURE

CLAIM TO DOMESTIC PRIORITY

The present non-provisional patent application claims priority to provisional application Ser. No. 60/865,110, entitled "Radiation Hardened MOSFET Structures," and filed on Nov. 9, 2006.

FIELD OF THE INVENTION

The present invention relates in general to electronic circuits and semiconductor devices and, more particularly, to a radiation hardened lateral MOSFET structure.

BACKGROUND OF THE INVENTION

MOSFETs (metal-oxide-semiconductor field-effect transistors) are commonly used in electronic circuits, such as communication systems and power supplies. Power MOSFETs are particularly useful when used as electric switches to enable and disable the conduction of relatively large currents. The current flow for MOSFETs goes between conduction contacts, e.g., from the source to the drain. The $R_{DSON}$ (static drain-source on-resistance) should be minimized for power loss and heat dissipation. The power MOSFET switch is typically contained within a monolithic device for ease of integration and system design.

In one application, power MOSFETs are used in military and space electronic systems. These systems may be exposed to various forms of radiation including heavy ions, electrons, and high-energy protons. Conventional power MOSFETs could be irreparably damaged by radiation exposure. Radiation hardened semiconductor devices are typically used to protect against radiation exposure.

Radiation hardness is characterized by the application of various test conditions. A single event failure mode measures the MOSFET's ability to survive a single high energy heavy ion strike. The failure modes include single event burnout (SEB) and single event gate rupture (SEGR). The total dose of ionizing radiation measures the sensitivity of the MOSFET's device parameters to the total ionizing dose (TID).

FIG. 1 illustrates a conventional vertical power MOSFET semiconductor die 10. Gate structure 12 is coupled by bond wire 14 to a first pin of leadframe 16. Source regions 20 are formed in the surface of the die. Source contact pads 21 are formed over source regions 20. P-base regions 22 are electrically connected or shorted through P+ regions 23 to source contact pads 21. Source contact pads 21 are coupled by bond wire 24 to a second pin of leadframe 16. N-epitaxial region 26 and N+ substrate 27 operate as the drain region of the MOSFET. Semiconductor die 10 is mounted to a die flag of leadframe 16.

FIG. 2 illustrates a conventional lateral power MOSFET 30. Gate structure 32 is coupled by bond wire 34 to a first pin of leadframe 36. Source region 40 is formed in the surface of the die. Source contact pad 41 is formed over source region 40. P-base region 42 is electrically connected or shorted through P+ regions 43 to source contact pad 41. Source contact pad 41 is coupled by bond wire 44 to a second pin of leadframe 36. Drain region 46 is coupled through N+ region 47 and bond wire 48 to a third pin of leadframe 36. P-epitaxial region 50 is formed over P+ substrate 52.

An equivalent circuit is shown in FIG. 3. MOSFET 60 includes drain 62, source 64, and gate 66. A parasitic bipolar junction transistor 68 is formed by N+ region 20, P-base 22, P-epitaxial 26, and N+ region 27 in FIG. 1. In FIG. 2, the parasitic bipolar junction transistor 68 is formed by N+ region 40, P-base 42, P-epitaxial 50, and N+ region 47. Accordingly, transistor 68 has a collector coupled to drain 62 and an emitter coupled to source 64. Current source 70 represents the high current pulse from ionizing radiation. Resistor 72 is the resistance of P-epitaxial region 50.

In the SEB failure mode, exposure to ionizing radiation creates hole current flow through P-base 22 of MOSFET 10. The hole current flow from the ion strike effectively creates a current pulse through the resistance of P-base 22 which triggers the parasitic transistor. The localized high current density can thermally damage the MOSFET causing device failure. The same situation applies for the lateral MOSFET.

IN SEGR failure mode, exposure to ionizing radiation creates hole current flow through P-base 22 of MOSFET 10. Positive charge accumulates on the surface under gate structure 12. A high electric field is formed across the gate dielectric causing the film to rupture and the device to fail. Again, the same situation applies for the lateral MOSFET.

SUMMARY OF THE INVENTION

In one embodiment, the present invention is a monolithic semiconductor device comprising a leadframe having a die flag and first and second wire bond pads. A semiconductor die is mounted to the die flag of the leadframe. The semiconductor die includes a substrate, an epitaxial layer formed over the substrate, and a source region formed in a surface of the semiconductor die. The source region is electrically connected to the die flag of the leadframe. The semiconductor die further includes a drain region formed in the surface of the semiconductor die, and a gate structure formed over a channel between the source region and drain region. The drain region is electrically connected to the first wire bond pad. The gate structure is electrically connected to the second wire bond pad.

In another embodiment, the present invention is a semiconductor device comprising a leadframe and a semiconductor die mounted to a die flag on the leadframe. The semiconductor die includes a substrate made with a semiconductor material having a first type of conductivity, and an epitaxial layer made with the semiconductor material having the first type of conductivity. The epitaxial layer is formed over the substrate. The semiconductor die further includes a first region made with a semiconductor material having a second type of conductivity. The first region is formed in a surface of the semiconductor die and is electrically connected to the die flag on the leadframe. The semiconductor die further includes a second region made with the semiconductor material having the second type of conductivity. The second region is formed in the surface of the semiconductor die and is electrically connected to a first wire bond pad on the leadframe. The semiconductor die further includes a gate structure formed over a channel between the first and second regions. The gate structure is electrically connected to a second wire bond pad on the leadframe.

In another embodiment, the present invention is a semiconductor device comprising a chip substrate having a die pad, and a semiconductor die mounted on the die pad of the chip substrate. The semiconductor die includes a substrate, and a source region formed in a surface of the semiconductor die. The source region is electrically connected to the die pad of the chip substrate. The semiconductor die further includes a drain region formed in the surface of the semiconductor die, and a gate structure formed over a channel between the source region and drain region.

In another embodiment, the present invention is a method of making a semiconductor device comprising the steps of providing a chip substrate having a die pad, and providing a semiconductor die by forming a substrate, forming an epitaxial layer over the substrate, forming a source region in a surface of the semiconductor die, forming a drain region in the surface of the semiconductor die, and forming a gate structure over a channel between the source region and drain region. The method further includes mounting the semiconductor die to the die pad on the chip substrate, and electrically connecting the source region to the die pad on the substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
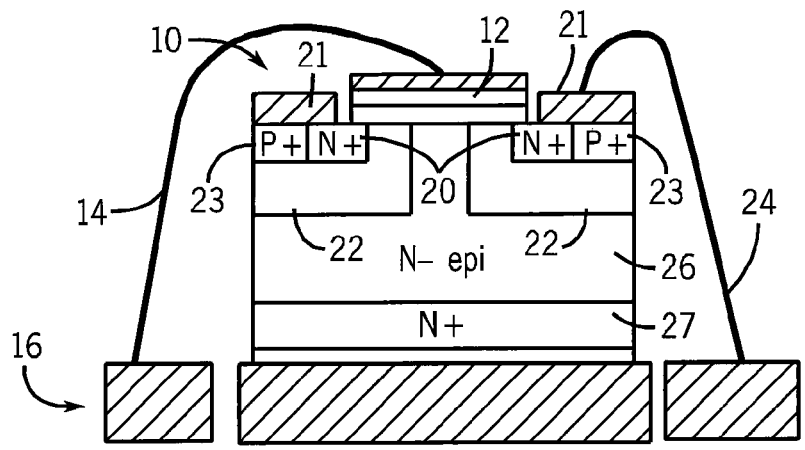
FIG. 1 illustrates a cross-sectional view of a conventional vertical MOSFET.
Figure 2:
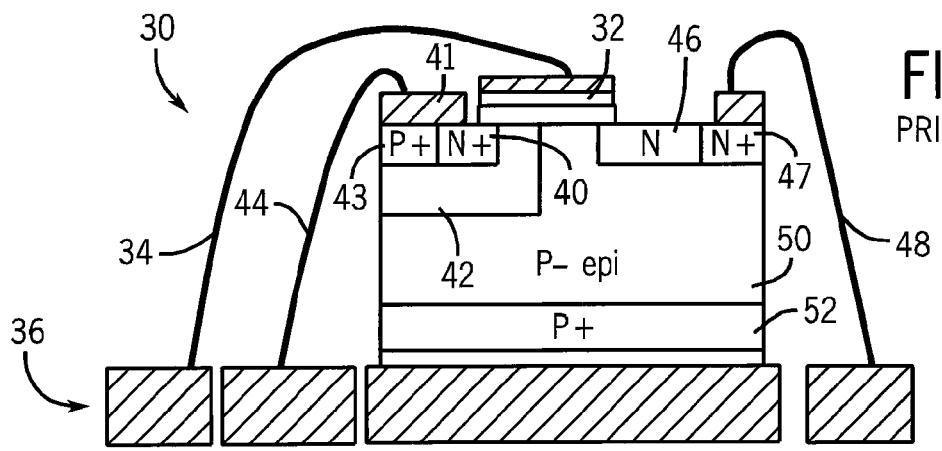
FIG. 2 illustrates a cross-sectional view of a conventional lateral MOSFET.
Figure 3:
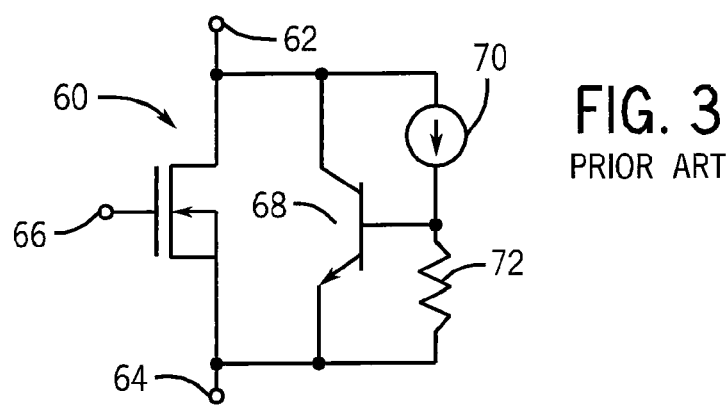
FIG. 3 is an equivalent circuit for the conventional MOSFET illustrating the effects of radiation exposure.
Figure 4:
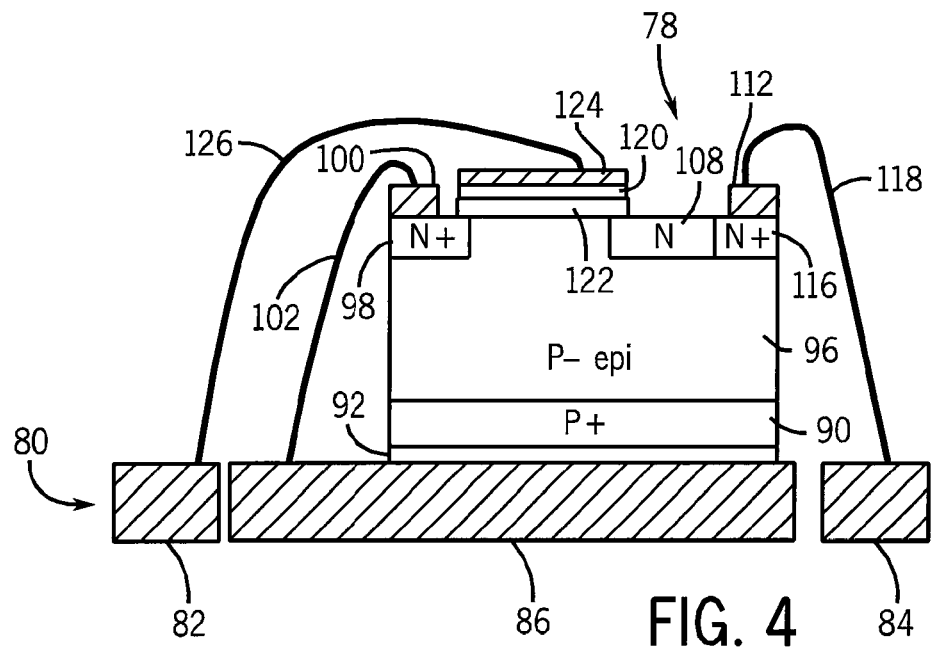
FIG. 4 illustrates a cross-sectional view of a radiation hardened lateral MOSFET.

Referring to FIG. 4, a radiation hardened monolithic semiconductor die 78 is shown mounted to leadframe 80. Semiconductor die 78 contains a lateral MOSFET. To realize a power MOSFET, a large number of individual MOSFETs or cells such as shown in FIG. 4 are connected in parallel in semiconductor die 78. The radiation hardened power MOSFET is useful in military and space electronic systems, which are exposed to various forms of radiation including heavy ions, electrons, and high-energy protons. Radiation hardened semiconductor devices provide protection against radiation exposure.

Leadframe 80 is made of copper (Cu) and has a plurality of electrically isolated wire bond pads 82 and 84. Leadframe 80 further has a die flag or pad 86 for mounting semiconductor die 78.

In the cross-sectional view of FIG. 4, semiconductor die 78 includes a substrate 90 which is made of p-type semiconductor material. Substrate 90 provides structural support. The following regions and layers are formed on substrate 90 using semiconductor manufacturing processes which include layering, patterning, doping, and heat treatment. In the layering process, materials are grown or deposited on the substrate by techniques involving thermal oxidation, nitridation, chemical vapor deposition, evaporation, and sputtering. Photolithography involves masking areas of the surface and etching away undesired material. The doping process injects concentrations of dopant material by thermal diffusion or ion implantation.

P+ substrate 90 is soldered to die flag 86 of leadframe 80 using solder material 92. P-epitaxial region 96 is formed over P+ substrate 90. N+ source region 98 is formed in the surface of semiconductor die 78. N+ source region 98 is implanted with arsenic (n-type semiconductor material) with dose of $1e^{15}$ at 900° C. for 20 minute anneal to drive the implant to about 0.1 micrometers (μm) junction depth. A wire bond contact pad 100 is formed on N+ source region 98. Contact pad 100 can be made with aluminum (Al), copper (Cu), tin (Sn), nickel (Ni), gold (Au), silver (Ag), or other electrically conductive material. The deposition of contact pad 100 uses an evaporation, electrolytic plating, electroless plating, or screen printing process. Bond wire 102 electrically connects N+ source region 98 through contact pad 100 to die flag 86. Bond wire 102 is made with Au.

In this embodiment, a P-base region is not formed adjacent to N+ source 98. The absence of a P-base region requires less horizontal space across the die and allows for a smaller cell pitch. The embodiment of FIG. 4 is applicable to MOSFETs designed for operating potential of 30 volts or less.

N drain region 108 is also formed in the surface of semiconductor die 78. N drain region 108 is implanted with arsenic with a dose of $2e^{12}$ and driven at 1150° C. for 180 minutes. A wire bond contact pad 112 is formed on N+ region 116, which is adjacent to N drain region 108, for good ohmic contact. Contact pad 112 can be made with Al, Cu, Sn, Ni, Au, Ag, or other electrically conductive material. The deposition of contact pad 112 uses an evaporation, electrolytic plating, electroless plating, or screen printing process. Bond wire 118 electrically connects N drain region 108 through N+ region 116 and contact pad 112 to wire bond pad 84 on leadframe 80. Bond wire 118 is made with Au.

A gate structure is formed over the channel between N+ source region 98 and N drain region 108. The gate structure includes gate region 120 and gate oxide 122. A wire bond contact pad 124 is formed on gate region 120 for good ohmic contact. Contact pad 124 can be made with Al, Cu, Sn, Ni, Au, Ag, or other electrically conductive material. The deposition of contact pad 124 uses an evaporation, electrolytic plating, electroless plating, or screen printing process. Bond wire 126 electrically connects gate region 120 through contact pad 124 to wire bond pad 82 on leadframe 80. Bond wire 126 is made with Au.

Figure 5:
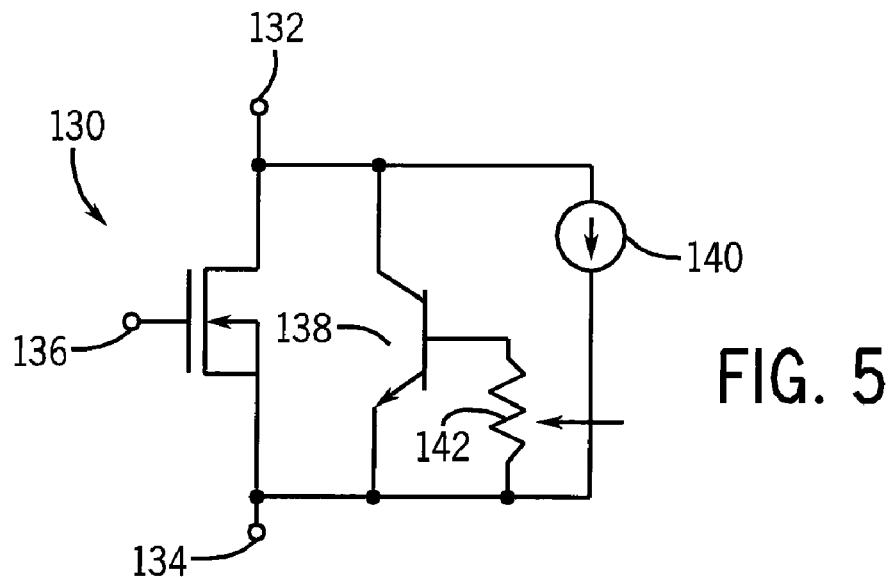
FIG. 5 is an equivalent circuit for the radiation hardened MOSFET illustrating the effects of radiation exposure.

FIG. 5 illustrates an equivalent circuit for the power MOSFET in semiconductor die 78. MOSFET 130 includes drain 132, source 134, and gate 136. A parasitic bipolar junction transistor 68 is formed by N+ region 98, P-epitaxial 96, and N+ region 112 in FIG. 4. Accordingly, transistor 138 has a collector coupled to drain 132 and an emitter coupled to source 134. Current source 140 represents the high current pulse from ionizing radiation. Resistor 142 is the resistance of P-epitaxial region 96.

In the SEB failure mode, the current pulse from ionizing radiation bypasses the base region of parasitic transistor 138. The electron component of the current pulse is discharged through the drain contact pad 112 to the wire bond pad 84 of leadframe 80. The hole component of source current for the current pulse is discharged through P+ substrate 90 to die flag 86 of leadframe 80. Still, substantially no current flows through resistor 142 to turn on parasitic transistor 138. The radiation hardening of the power MOSFET, as described in FIG. 4, avoids triggering the parasitic transistor 140 and prevents thermal failure of the device in the presence of the SEB.

In SEGR failure mode, positive charges are routed away from the surface of semiconductor die 78 to substrate 90. Since positive charges do not accumulate under the gate region 120, minimal gate stress occurs during the radiation event. The radiation hardening of the power MOSFET, as described in FIG. 4, improves the SEGR reliability.

The TID can be enhanced by selecting the thickness of gate oxide 122 in the range of 70-300 angstroms (Å). More specifically, the target gate oxide thickness can be 70, 90, 125, 200, 250, or 300 Å. With this range of gate oxide thickness, the rate of oxide charge trapping reduces, as does the rate interface charge trapping. The magnitude of threshold voltage shift is thus reduced for a given TID.

Figure 6:
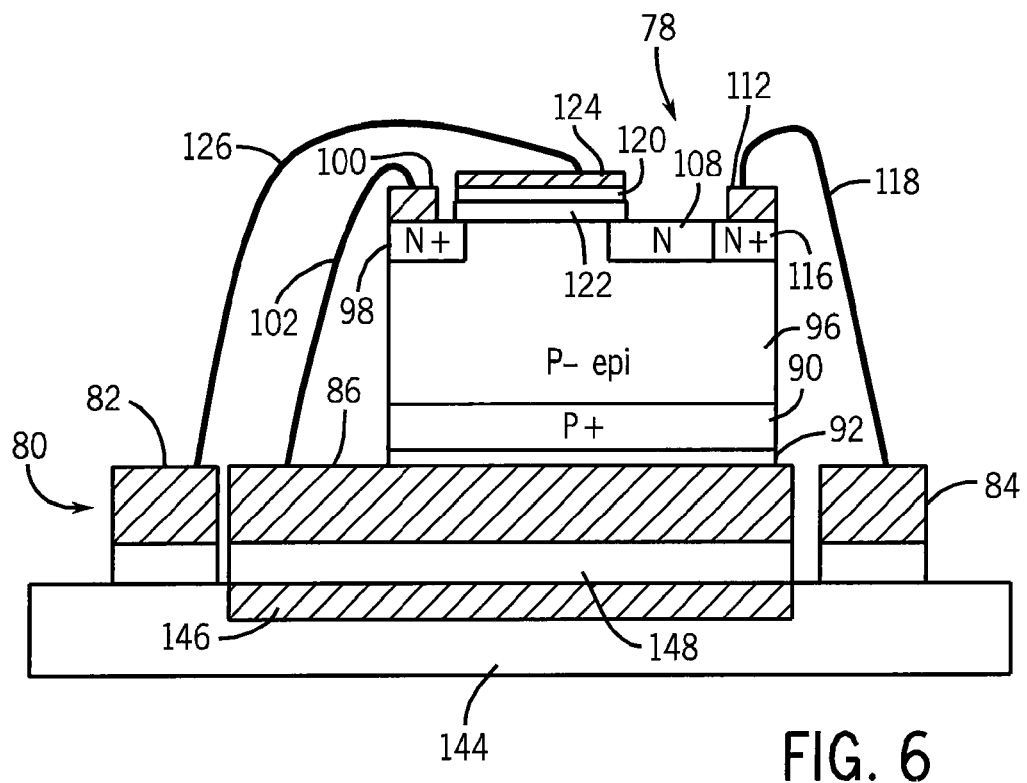
FIG. 6 illustrates the radiation hardened lateral MOSFET with thermal transfer from die flag of leadframe to ground plane of PCB.

FIG. 6 illustrates leadframe 80 mounted to printed circuit board (PCB) 144. Die flag 86 is soldered to ground plane 146 with solder material 148 for heat dissipation.

Figure 7:
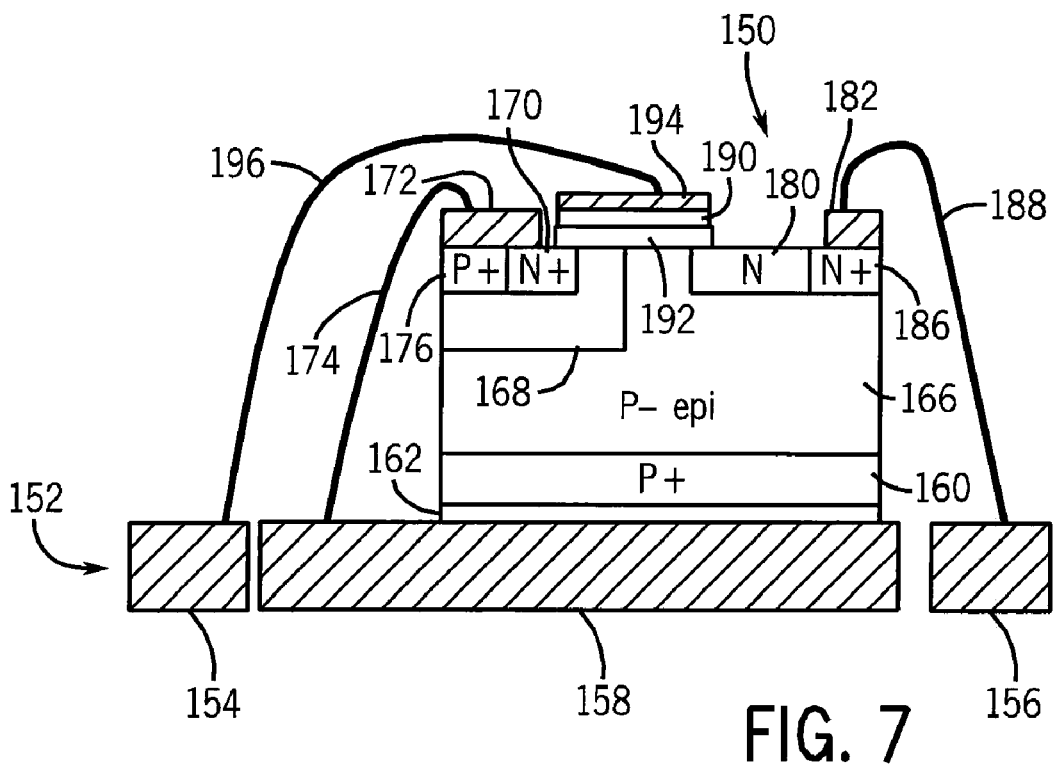
FIG. 7 illustrates an alternate embodiment of the radiation hardened lateral MOSFET with a P-base region electrically shorted to a source contact.

Turning to FIG. 7, an alternate embodiment of the radiation hardened lateral MOSFET is shown with a P-base region electrically connected or shorted to the source contact pad. Monolithic semiconductor die 150 is mounted to leadframe 152. Semiconductor die 150 contains a lateral power MOSFET. To realize a power MOSFET, a large number of individual MOSFETs or cells such as shown in FIG. 7 are connected in parallel in semiconductor die 150. Leadframe 152 is made of Cu and has a plurality of electrically isolated wire bond pads 154 and 156. Leadframe 152 further has a die flag 158 for mounting semiconductor die 150.

In the cross-sectional view of FIG. 7, semiconductor die 150 includes a substrate 160 which is made of p-type semiconductor material. Substrate 160 provides structural support. P+ substrate 160 is soldered to die flag or pad 158 of leadframe 152 using solder material 162. P-epitaxial region 166 is formed over P+ substrate 160. P-base region 168 is formed in P-epitaxial region 166 adjacent to N+ source region 170. P-base region 168 is electrically connected or shorted to source contact pad 172 through P+ region 176. N+ source region 170 is formed in the surface of semiconductor die 150. N+ source region 170 is implanted with arsenic with dose of $1e^{15}$ at 900° C. for 20 minute anneal to drive the implant to about 0.1 µm junction depth. A wire bond contact pad 172 is formed on N+ source region 170. Contact pad 172 can be made with Al, Cu, Sn, Ni, Au, Ag, or other electrically conductive material. The deposition of contact pad 172 uses an evaporation, electrolytic plating, electroless plating, or screen printing process. Bond wire 174 electrically connects N+ source region 170 and P+ region 176 through contact pad 172 to die flag 158. Bond wire 174 is made with Au.

N drain region 180 is also formed in the surface of semiconductor die 150. N drain region 108 is implanted with arsenic with a dose of $2e^{12}$ and driven at 1150° C. for 180 minutes. A wire bond contact pad 182 is formed on N+ region 186, which is adjacent to N drain region 180, for good ohmic contact. Contact pad 182 can be made with Al, Cu, Sn, Ni, Au, Ag, or other electrically conductive material. The deposition of contact pad 182 uses an evaporation, electrolytic plating, electroless plating, or screen printing process. Bond wire 188 electrically connects N drain region 180 through N+ region 186 and contact pad 182 to wire bond pad 156 on leadframe 152. Bond wire 188 is made with Au.

A gate structure is formed over the channel between N+ source region 170 and N drain region 180. The gate structure includes gate region 190 and gate oxide 192. A wire bond contact pad 194 is formed on gate region 190 for good ohmic contact. Contact pad 194 can be made with Al, Cu, Sn, Ni, Au, Ag, or other electrically conductive material. The deposition of contact pad 194 uses an evaporation, electrolytic plating, electroless plating, or screen printing process. Bond wire 196 electrically connects gate region 190 through and contact pad 194 to wire bond pad 154 on leadframe 152. Bond wire 196 is made with Au.

In the SEB failure mode, the current pulse from ionizing radiation bypasses the base region of parasitic transistor 138. The equivalent circuit shown in FIG. 5 is applicable to the power MOSFET in FIG. 7. The electron component of the current pulse is discharge through drain contact pad 182 to wire bond pad 156 of leadframe 152. The hole component of source current for the current pulse is discharged through P+ substrate 160 to die flag 158 of leadframe 152. Still, substantially no current flows through resistor 142 to turn on parasitic transistor 138. In the SEB failure mode, hole current from ionizing radiation bypasses the base region of parasitic transistor 138. The radiation hardening of the power MOSFET, as described in FIG. 7, avoids triggering the parasitic transistor 140 and prevents thermal failure of the device in the presence of the SEB.

In SEGR failure mode, positive charges are routed away from the surface of semiconductor die 150 to P+ substrate 160. Since positive charges do not accumulate under the gate region 190, minimal gate stress occurs during the radiation event. The radiation hardening of the power MOSFET, as described in FIG. 7, improves the SEGR reliability.

The TID can be enhanced by selecting the thickness of gate oxide 192 in the range of 70-300 Å. More specifically, the target gate oxide thickness can be 70, 90, 125, 200, 250, or 300 Å. With this range of gate oxide thickness, the rate of oxide charge trapping reduces as does the rate interface charge trapping. The magnitude of threshold voltage shift is thus reduced for a given TID.

Figure 8:
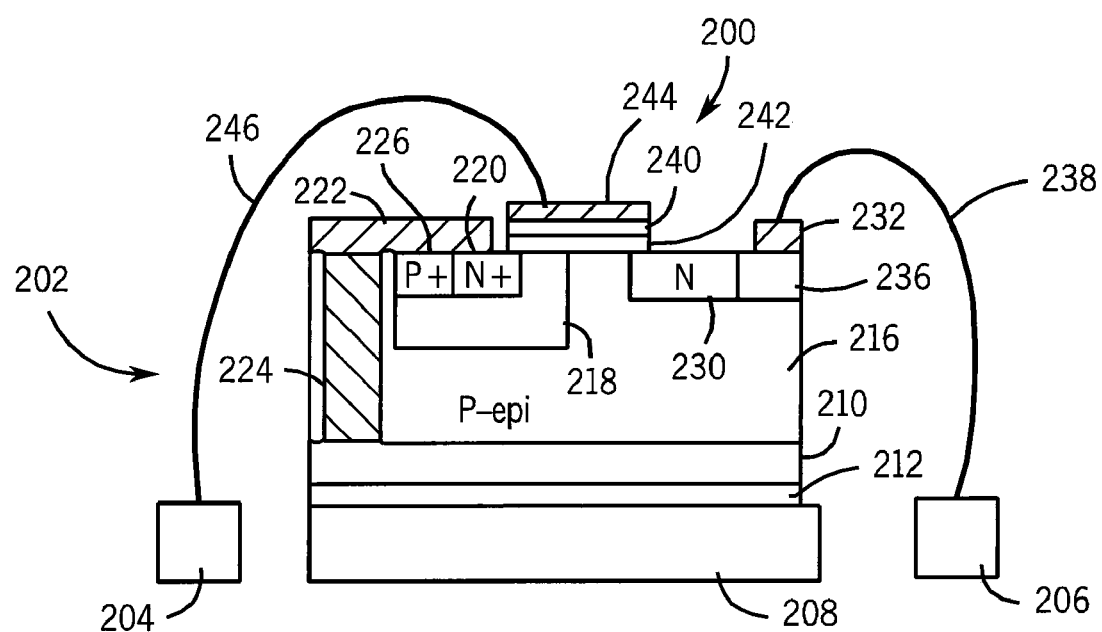
FIG. 8 illustrates the radiation hardened lateral MOSFET with substrate contact between source contact pad and chip substrate.

In FIG. 8, an alternate embodiment of the radiation hardened lateral MOSFET is shown with conduction path between source contact pad and P+ substrate made through the semiconductor die. The embodiment in FIG. 8 is applicable to wafer level chipscale packaging, which does not require a leadframe.

Monolithic semiconductor die 200 is mounted to printed circuit board or chip scale substrate 202. Semiconductor die 200 contains a lateral power MOSFET. To realize a power MOSFET, a large number of individual MOSFETs or cells such as shown in FIG. 8 are connected in parallel in semiconductor die 200. Substrate 202 has a plurality of electrically isolated contact pads 204 and 206. Substrate 202 further has a die pad 208 for mounting semiconductor die 200.

In the cross-sectional view of FIG. 8, semiconductor die 200 includes a substrate 210 which is made of p-type semiconductor material. Substrate 210 provides structural support. P+ substrate 210 is soldered to die pad 208 of substrate 202 using solder material 212. P-epitaxial region 216 is formed over P+ substrate 210. P-base region 218 is formed in P-epitaxial region 216 adjacent to N+ source region 220. P-base region 218 is electrically connected or shorted to source contact pad 222 through P+ region 226. N+ source region 220 is formed in the surface of semiconductor die 200. N+ source region 220 is implanted with arsenic with dose of $1e^{15}$ at 900° C. for 20 minute anneal to drive the implant to about 0.1 µm junction depth. A contact pad 222 is formed on N+ source region 220. Contact pad 222 can be made with Al, Cu, Sn, Ni, Au, Ag, or other electrically conductive material. The deposition of contact pad 222 uses an evaporation, electrolytic plating, electroless plating, or screen printing process. A low resistance substrate contact 224 electrically connects N+ source region 220 and P+ region 226 through contact pad 222 to die pad 208. Substrate contact 224 formed as a trench which is filled with conductive material such as heavily doped polysilicon or metal such as tungsten.

N drain region 230 is also formed in the surface of semiconductor die 200. N drain region 108 is implanted with arsenic with a dose of $2e^{12}$ and driven at 1150° C. for 180 minutes. A contact pad 232 is formed on N+ region 236, which is adjacent to N drain region 230, for good ohmic contact. Contact pad 232 can be made with Al, Cu, Sn, Ni, Au, Ag, or other electrically conductive material. The deposition of contact pad 232 uses an evaporation, electrolytic plating, electroless plating, or screen printing process. Bond wire or pin 238 electrically connects N drain region 230 through N+ region 236 and contact pad 232 to contact pad 206 on substrate 202.

A gate structure is formed over the channel between N+ source region 220 and N drain region 230. The gate structure includes gate region 240 and gate oxide 242. A contact pad 244 is formed on gate region 240 for good ohmic contact. Contact pad 244 can be made with Al, Cu, Sn, Ni, Au, Ag, or other electrically conductive material. The deposition of contact pad 244 uses an evaporation, electrolytic plating, electroless plating, or screen printing process. Bond wire or pin 246 electrically connects gate region 240 through and contact pad 244 to contact pad 204 on substrate 202.

In the SEB failure mode, the current pulse from ionizing radiation bypasses the base region of parasitic transistor 138. The equivalent circuit shown in FIG. 5 is applicable to the power MOSFET in FIG. 8. The electron component of the current pulse is discharged through the drain contact pad 232 to contact pad 206 of substrate 202. The hole component of source current for the current pulse is discharged through P+ substrate 210 to die pad 208 of substrate 202. Still, substantially no current flows through resistor 142 to turn on parasitic transistor 138.

In SEGR failure mode, positive charges are routed away from the surface of semiconductor die 200 to P+ substrate 210. Since positive charges do not accumulate under the gate region 240, minimal gate stress occurs during the radiation event. The radiation hardening of the power MOSFET, as described in FIG. 8, improves the SEGR reliability.

The TID can be enhanced by selecting the thickness of gate oxide 192 in the range of 70-300 Å. More specifically, the target gate oxide thickness can be 70, 90, 125, 200, 250, or 300 Å. With this range of gate oxide thickness, the rate of oxide charge trapping reduces as does the rate interface charge trapping. The magnitude of threshold voltage shift is thus reduced for a given TID.

While one or more embodiments of the present invention have been illustrated in detail, the skilled artisan will appreciate that modifications and adaptations to those embodiments may be made without departing from the scope of the present invention as set forth in the following claims.

What is claimed:

1. A monolithic semiconductor device, comprising:
   a leadframe having a die flag and first and second wire bond pads; and
   a semiconductor die mounted to the die flag of the leadframe, the semiconductor die including,
   (a) a substrate,
   (b) an epitaxial layer formed over the substrate,
   (c) a source region formed in a surface of the semiconductor die, the source region being electrically connected to the die flag of the leadframe,
   (d) a drain region formed in the surface of the semiconductor die, the drain region being electrically connected to the first wire bond pad, and
   (e) a gate structure formed over a channel between the source region and drain region, the gate structure being electrically connected to the second wire bond pad.

2. The monolithic semiconductor device of claim 1, wherein the gate structure includes:
   an oxide layer formed over the channel; and
   a gate region formed over the oxide layer.

3. The monolithic semiconductor device of claim 2, wherein the oxide layer has a thickness ranging from 70-300 angstroms.

4. The monolithic semiconductor device of claim 1, further including a contact pad formed on the source region.

5. The monolithic semiconductor device of claim 4, further including a base region formed in the surface of the semiconductor die adjacent to the source region, the base region being electrically connected to the contact pad.

6. The monolithic semiconductor device of claim 4, further including a bond wire coupled between the contact pad and the die flag on the leadframe.

7. The monolithic semiconductor device of claim 1, wherein the semiconductor device is a power MOSFET.

8. A semiconductor device, comprising:
   a leadframe; and
   a semiconductor die mounted to a die flag on the leadframe, the semiconductor die including,
   (a) a substrate made with a semiconductor material having a first type of conductivity,
   (b) an epitaxial layer made with the semiconductor material having the first type of conductivity, the epitaxial layer being formed over the substrate,
   (c) a first region made with a semiconductor material having a second type of conductivity, the first region being formed in a surface of the semiconductor die and electrically connected to the die flag on the leadframe,
   (d) a second region made with the semiconductor material having the second type of conductivity, the second region being formed in the surface of the semiconductor die and electrically connected to a first wire bond pad on the leadframe, and
   (e) a gate structure formed over a channel between the first and second regions, the gate structure being electrically connected to a second wire bond pad on the leadframe.

9. The semiconductor device of claim 8, wherein the gate structure includes:
   an oxide layer formed over the channel; and
   a gate region made with the semiconductor material having the first type of conductivity, the gate region being formed over the oxide layer.

10. The semiconductor device of claim 9, wherein the oxide layer has a thickness ranging from 70-300 angstroms.

11. The semiconductor device of claim 8, further including a contact pad formed on the first region.

12. The semiconductor device of claim 11, further including a base region made with the semiconductor material having the first type of conductivity, the base region being formed in the surface of the semiconductor die adjacent to the first region, the base region being electrically connected to the contact pad.

13. The semiconductor device of claim 11, further including a bond wire coupled between the contact pad and the die flag on the leadframe.

14. The monolithic semiconductor device of claim 8, further including a printed circuit board having a ground plane, wherein the die flag is thermally coupled to the ground plane.

15. A semiconductor device, comprising:
   a chip substrate having a die pad; and
   a semiconductor die mounted on the die pad of the chip substrate, the semiconductor die including,
   (a) a substrate,
   (b) a source region formed in a surface of the semiconductor die, the source region being electrically connected to the die pad of the chip substrate,
   (c) a drain region formed in the surface of the semiconductor die, and
   (d) a gate structure formed over a channel between the source region and drain region.

16. The semiconductor device of claim 15, further including an epitaxial layer formed over the substrate.

17. The semiconductor device of claim 15, wherein the drain region is electrically connected to a first contact pad on the chip substrate and the gate structure is electrically connected to a second contact pad on the chip substrate.

18. The semiconductor device of claim 15, wherein the gate structure includes:
   an oxide layer formed over the channel; and
   a gate region formed over the oxide layer.

19. The semiconductor device of claim 15, further including a contact pad formed on the source region.

20. The semiconductor device of claim 19, further including a base region formed in the surface of the semiconductor die adjacent to the source region, the base region being electrically connected to the contact pad.

* * * * *